(12) United States Patent
Degroot et al.

(10) Patent No.: US 7,942,508 B2
(45) Date of Patent: May 17, 2011

(54) DECREASED ACTUATION VOLTAGE IN MEMS DEVICES BY CONSTRAINING MEMBRANE DISPLACEMENT WITHOUT USING CONDUCTIVE "LANDING PAD"

(75) Inventors: Joseph A. Degroot, Webster, NY (US); Peter Michael Gulvin, Webster, NY (US); Jun Ma, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 351 days.

(21) Appl. No.: 12/164,349

(22) Filed: Jun. 30, 2008

(65) Prior Publication Data

US 2009/0322827 A1 Dec. 31, 2009

(51) Int. Cl.
*B41J 2/045* (2006.01)

(52) U.S. Cl. ............... 347/68; 347/54; 347/70

(58) Field of Classification Search ........... 347/20, 347/54, 68, 70–71; 60/527–529; 310/306, 310/307, 328–330; 337/139–140
See application file for complete search history.

(56) References Cited

U.S. PATENT DOCUMENTS 6,357,856 B1 * 3/2002 Otsuki ........................... 347/43

* cited by examiner

*Primary Examiner* — Juanita D Stephens
(74) *Attorney, Agent, or Firm* — MH2 Technology Law Group LLP

(57) ABSTRACT

The present application is directed to electrostatic actuators, and methods of making electrostatic actuators. In one embodiment, an electrostatic actuator of the present application can include an electrode layer and a mechanical member. The electrode layer can include a removed portion that is free of a landing pad. The mechanical member can be positioned in proximity to the electrode layer so as to provide a gap therebetween. The mechanical member can further include a dimple structure protruding out into the gap and aligned with the removed portion of the electrode layer. When in operation, the mechanical member can be capable of deflecting toward the electrode layer. The electrostatic actuator can be used in a fluid drop ejector for ink jet recording or printing devices.

12 Claims, 4 Drawing Sheets

DECREASED ACTUATION VOLTAGE IN MEMS DEVICES BY CONSTRAINING MEMBRANE DISPLACEMENT WITHOUT USING CONDUCTIVE "LANDING PAD"

DESCRIPTION OF THE DISCLOSURE

1. Field of the Disclosure

The present application is directed to an electrostatic actuator, and more particularly to an electrostatic actuator free of the conductive landing pad.

2. Background of the Disclosure

In MEMS devices, e.g., electrostatic actuators, when a mechanical member (e.g., membrane or cantilever) is deflected electrostatically by electrostatic forces, electrical contact between the mechanical member and driving electrode must be avoided to eliminate shorting of the device. Additionally, the distance between the mechanical member and driving electrode must be controlled to prevent breakdown of the air in the gap between the member and electrode. This breakdown can cause damage to the device.

MEMS inkjet print heads for ink jet recording or printing devices tackle the above described problems by creating a dimple structure in the membrane and a landing pad in the driving electrode that is electrically grounded. When the membrane is actuated, the dimple structure hits the landing pad and the displacement of the membrane is constrained.

Although the combined use of the landing pad and dimple structure helps to solve the problem of breakdown-induced damage, it creates additional problems. One of the most significant problems is that the area of the driving electrode has been reduced, which causes the force on the membrane to decrease for a given voltage. As a result, the required voltage to pull the membrane down (and thereby operate the device) is substantially increased. Such increased drive voltage can cause additional problems including increased cost and die area for drive circuitry and risk of breakdown damage.

Thus, there is a need to overcome these and other problems of the prior art and to provide an electrostatic actuator device having reduced driving voltage by omitting the landing pad that is used in the prior art.

SUMMARY OF THE DISCLOSURE

According to various embodiments, the present teachings include an actuator device. The actuator device can include an electrode layer that has a removed portion out of the electrode layer. The removed portion is free of a conventionally used landing pad. The actuator device can further include a mechanical member positioned in proximity to the electrode layer so as to provide a gap therebetween. The mechanical member can have a dimple structure protruding out into the gap and aligned with the removed portion of the electrode layer. When in operation, the mechanical member can be capable of deflecting toward the electrode layer.

According to various embodiments, the present teachings also include a method for forming an actuator device. In the method, an electrode layer can be deposited over an insulator layer. A portion of the electrode layer can then be removed, followed by forming a mechanical member in proximity to the electrode layer so as to provide a gap therebetween. The formed mechanical member can include a dimple structure protruding out into the gap and aligned with the removed portion of the electrode layer so as to control the minimum contact spacing between the mechanical member and the electrode layer.

According to various embodiments, the present teachings also include a fluid drop ejector. The fluid drop ejector can include an electrode layer with a removed portion out of the electrode layer, wherein the removed portion is free of a landing pad so as to provide an increased electrode area. The fluid drop ejector can also include a mechanical member positioned in proximity to and aligned with the electrode layer so as to provide a gap therebetween. When in operation, the mechanical member can be capable of deflecting toward the electrode layer. The fluid drop ejector can further include a face plate layer surrounding the mechanical member to form a fluid pressure chamber between the face plate layer and the mechanical member where fluid is capable of being stored. The face plate layer can have a nozzle through which the fluid can be ejected.

According to various embodiments, the present teachings further include a printer containing at least one fluid drop ejector as described above.

Additional objects and advantages of the disclosure will be set forth in part in the description which follows, and can be learned by practice of the disclosure. The objects and advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Figure 1:
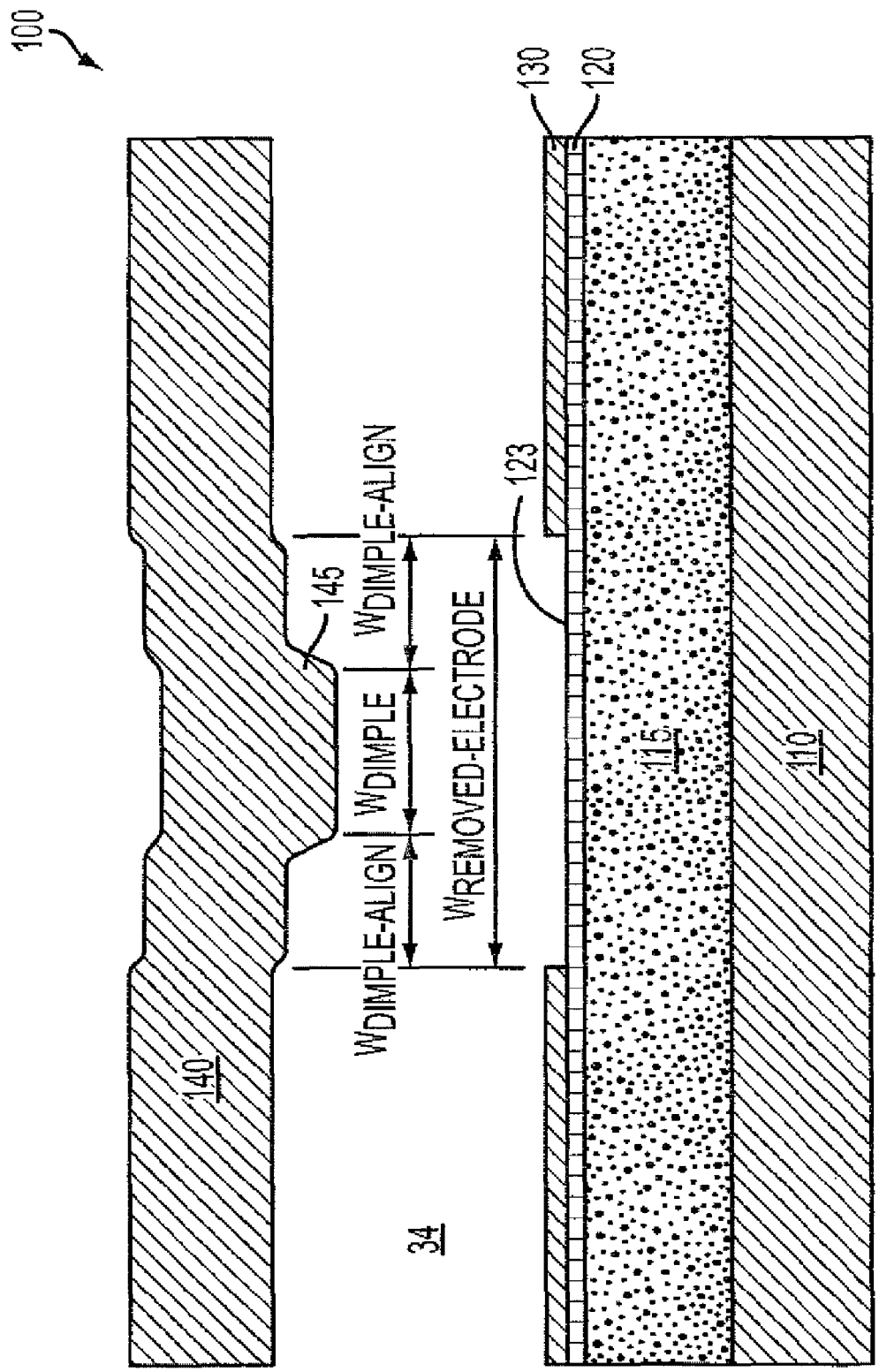
FIG. 1 illustrates an exemplary electrostatic actuator device in accordance with the present teachings.

FIG. 1 illustrates an exemplary electrostatic actuator device 100 in accordance with the present teachings. Specifically, FIG. 1 is a cross-sectional schematic of a portion of the exemplary electrostatic actuator device. It should be readily apparent to one of ordinary skill in the art that the device 100 depicted in FIG. 1 represents a generalized schematic illustration and that other layers/materials/structures can be added or existing layers/materials/structures can be removed or modified.

As shown, the electrostatic actuator device 100 can include a substrate 110, insulator layers 115, and 120, an electrode layer 130 and a mechanical member 140 having a dimple structure 145.

The electrode layer 130 can be a driving electrode formed on the substrate 110. For purposes of this application, the term "on" is defined so as not to require direct physical contact. Thus, for example, as illustrated in FIG. 1, the insulators layer 115 and/or 120 can be formed between the electrode layer 130 and the substrate 110. That is, the electrode layer 130 can be disposed over the insulator layers 120 and/or 115 that can be formed over the substrate 110. In other embodiments, the electrode layer 130 can be formed in direct physical contact with the substrate 110. The electrode layer 130 can further include a removed portion/area, e.g., in the center of the electrode layer 130, by etching a portion of the electrode material of the electrode layer. Accordingly, an exposed portion 123 of the underlying layer 120 can be obtained.

The substrate 110 can be formed of any desired material that can provide suitable mechanical support for the device 100. Examples of substrates can include semiconductor wafers, such as silicon wafers, silicon carbide wafers and gallium arsenide wafers, and insulating substrates, such as glass substrates.

The insulator layers 115, and 120 can include any suitable material with appropriate electrically insulating (i.e., dielectric) properties, and which can be otherwise compatible for use in electrostatic actuators. Examples of suitable insulator materials can include, but are not limited to, silicon dioxide, silicon nitride, phosphosilicate glass (PSG) or any insulating materials including polymers. For example, the insulator layer 115 can be any suitable dielectric material, such as a silicon oxide, that provides a thickness for the desired electrical insulation between substrate 110 and the electrode layer 130. The thickness of the insulator layer 115 can range, e.g., from about 0.1 micron to about 2 microns.

The mechanical member 140, e.g., a mechanical membrane or a cantilever, can be positioned in proximity to the electrode layer 130 so as to provide a gap 34 between the electrode layer 130 and the mechanical member 140. The mechanical member 140 can further include a dimple structure 145 protruded from the mechanical member 140, into the gap 34, and toward the electrode layer 130. The dimple structure 145 can be aligned with the removed electrode area of the electrode layer 130.

In various embodiments, the mechanical membrane 140 and the gap 34 can be formed using surface micromachining techniques. For example, a sacrificial material (not shown), such as a sacrificial oxide of phosphosilicate glass (PSG) can be conformably deposited onto each surface of electrode layer 130 and the exposed portion 123 of the underlying insulating layer 120. In an exemplary embodiment, one or more sacrificial layer can be conformably deposited and/or partially etched to form a complementary structure with respect to the structure of the desired mechanical membrane 140. Once the mechanical membrane 140 having the dimple structure 145 is formed, the sacrificial material can be removed and thereby leaving the gap 34.

As is well known in the art, a voltage can be applied to the (driving) electrode layer 130 in order to control movement of the mechanical member 140. For example, the mechanical member 140 can be controlled so as to deflect toward the driving electrode layer 130. In various embodiments, the electrode layer 130 and the mechanical member 140 can be formed of any suitable electrically conductive material. Examples of such materials can include doped polysilicon, conducting polymers, or metals, such as aluminum. In addition, the electrode layer 130 and the mechanical member 140 can have any suitable thickness. For example, the electrode layer 130 can have a thickness ranging from about 0.1 micron to about 1 micron, such as about 0.3 micron. The mechanical member 140 can have a thickness ranging from about 0.5 micron to about 5 microns, such as about 2 microns. The gap 34 between the mechanical member 140 and the electrode layer 130 can be filled with any suitable fluid that allows the desired movement of the mechanical member 140. In one embodiment, the gap 34 can be an air gap, as is well known in the art.

In operation, when a voltage potential is applied to the electrode 130 to attract the mechanical member 140 and cause it to deflect, the aligned dimple structure 145 can contact, e.g., the exposed portion 123 of the underlying insulator layer 120 through the electrode layer 130, and thereby defining a minimum contact spacing $S_{min}$ between the electrode layer 130 and the mechanical member 140. In various embodiments, the minimum contact spacing $S_{min}$ between the electrode layer 130 and the mechanical member 140 can be chosen to be any suitable distance. For example, $S_{min}$ can range from about 0.1 micron to about 1 micron, such as, about 0.5 micron in certain embodiments. In one embodiment, the minimum contact spacing $S_{min}$ can have a thickness depending on the thickness of the dimple structure 145.

Figure 2:
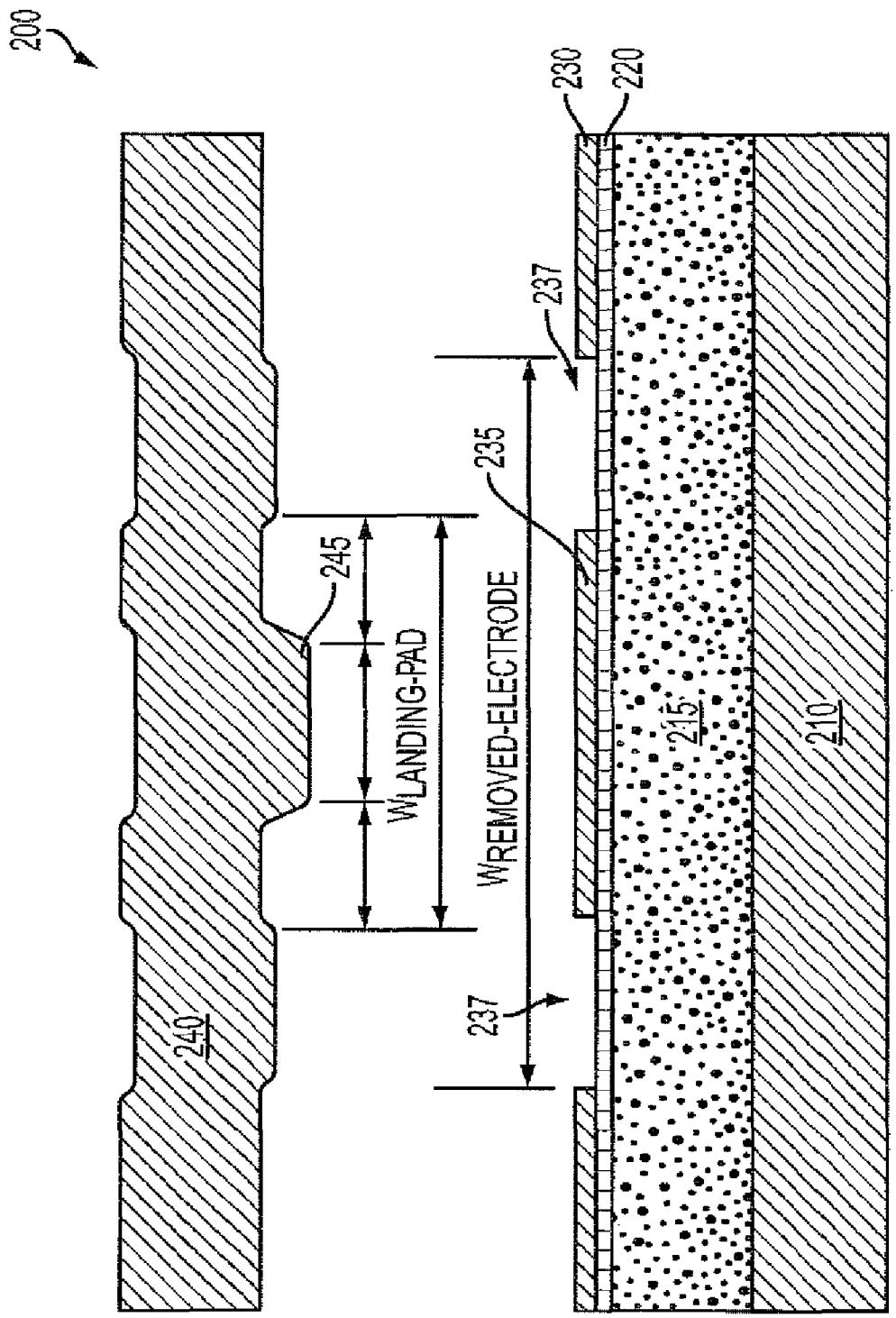
FIG. 2 illustrates one example of an electrostatic actuator in a related state.

For better understanding the present teachings, FIG. 2 illustrates one example of a conventional electrostatic actuator 200. As shown in FIG. 2, the conventional electrostatic actuator 200 in the prior art can include a substrate 210, insulator layers 215 and 220, and an electrode layer 230 including a landing pad 235 and electrode cuts 237 formed in both sides of the landing pad 235 in the center of the electrode layer 230 over the insulator layer 220. The electrode cuts 237 are necessary for forming the landing pad 235 because they can allow the landing pads 235 to be electrically isolated from the electrode 230. For example, each electrode cut 237 in certain embodiments can be at least about 3 microns wide. In addition, the conventional actuator 200 can include a mechanical member 240 having a dimple structure 245 as shown in FIG. 2.

As compared with the conventional actuator device 200 of FIG. 2, the disclosed actuator device 100 of FIG. 1 can be free of the landing pad (e.g., 235) as well as free of the electrode cuts 237. On the contrary, the disclosed actuator device 100 can offset the dimple structure 145 down to the surface 123 by the thickness of the electrode layer 130 due to, e.g., the use of conformably deposited sacrificial material to form the gap 34 as described above. As a result, a higher effective dimple height can be obtained, which is needed for operation due to the removal of the landing pad.

Additionally, the disclosed actuator device 100 can reduce the removed electrode area as compared with the actuator 200 in the prior art. As shown in FIG. 1, the removed electrode area required by the design rule and the manufacturing process, can be determined by the corresponding width of the dimple structure 145 ($W_{Dimple}$) as well as the width of a dimple alignment tolerance ($W_{Dimple-alignment}$) required by design rules for each side of the dimple structure 145 for the alignment of the dimples structure 145 with the removed area of the electrode layer 130. The width of the removed area ($W_{Removed-electrode}$) can thus be determined by the dimple width ($W_{Dimple}$) plus the width of the dimple alignment tolerance ($W_{Dimple-alignment}$) showing as following:

$$W_{Removed-electrode} = W_{Dimple} + W_{Dimple-alignment} \quad (1)$$

While for the conventional device 200 shown in FIG. 2, the removed electrode area can be determined by the width of landing pad 235 ($W_{Landing\ pad}$) and the electrode cut 237 ($W_{landing-pad-cut}$) required for both sides of the landing pad. The width of landing pad ($W_{Landing\ pad}$) can further be determined by the corresponding widths of the aligned dimple structure 245 ($W_{Dimple}$) as well as the dimple alignment tolerance ($W_{Dimple-alignment}$) shown in FIG. 2. The width of the removed electrode for the conventional device 200 can therefore be determined by:

$$W_{Removed-electrode} = W_{Dimple} + W_{Dimple-alignment} + W_{Landing-pad-cut} \quad (2)$$

Comparing equation (1) with equation (2), the disclosed actuator device 100 can have less removed electrode area because there is no need to remove extra electrode material due to the electrical cut 237 for the landing pad 235. During operation of the device 100, the dimple structure 145 can contact the exemplary field nitride 120 on the surface portion 123 instead of the grounded electrode, e.g., 235 in FIG. 2.

In a certain embodiment, the disclosed actuator device 100 can include a polysilicon mechanical membrane having a dimple structure of about 0.5 micron thick and about 3 micron wide. In this specific embodiment, a polysilicon electrode layer of about 0.3 micron thick can be formed having a removed portion of about 7 microns wide in the center of the polysilicon electrode.

In this manner, the disclosed actuator 100 shown in FIG. 1 can provide many advantages. First, the disclosed actuator 100 can completely remove the landing pad (e.g., 235 in FIG. 2) used in the conventional device. This can provide an increased electrode area especially in the center of the device 100, where the electrode area is most efficient at displacing (e.g., pulling down) the mechanical member 140. As disclosed herein, the increase in electrode area can be a result of the elimination of the landing pad (235 in FIG. 2).

In addition, the removal of landing pad can not only reduce the removed electrode area and thus increase the working electrode area, but also can reduce the required driving voltage applied on the electrode 130. For example, the voltage required to achieve the required drop speed in an ink jet printer can be reduced significantly. In an exemplary embodiment for a device having dimensions of about 100 microns wide by about 1000 micron long, the required driving voltage can be reduced, e.g., from about 160V to about 150V, due to the removal of the landing pad. Still in this example, a reduction of the maximum electric field can be obtained, e.g., from about 324 V/M to about 294 V/m. The disclosed device 100 can then be more robust to field induced breakdown.

In various embodiments, the disclosed actuator device 100 can provide many more advantages including, for example, increased force on the mechanical member 140 for a given drive voltage on the electrode layer 130; decreased voltage required to attain a given drop velocity; decreased drive circuitry requirements for a given design; decreased size and cost in driver die for a given design; greater design latitude due to decreased voltage that is more design feasible; simplicity of design that is no need to ground a landing pad; reduction in electrical field in air gap for a given design; reduction in field-induced breakdown damage; and requirement for simple changes from current fabrication process.

Figure 3:
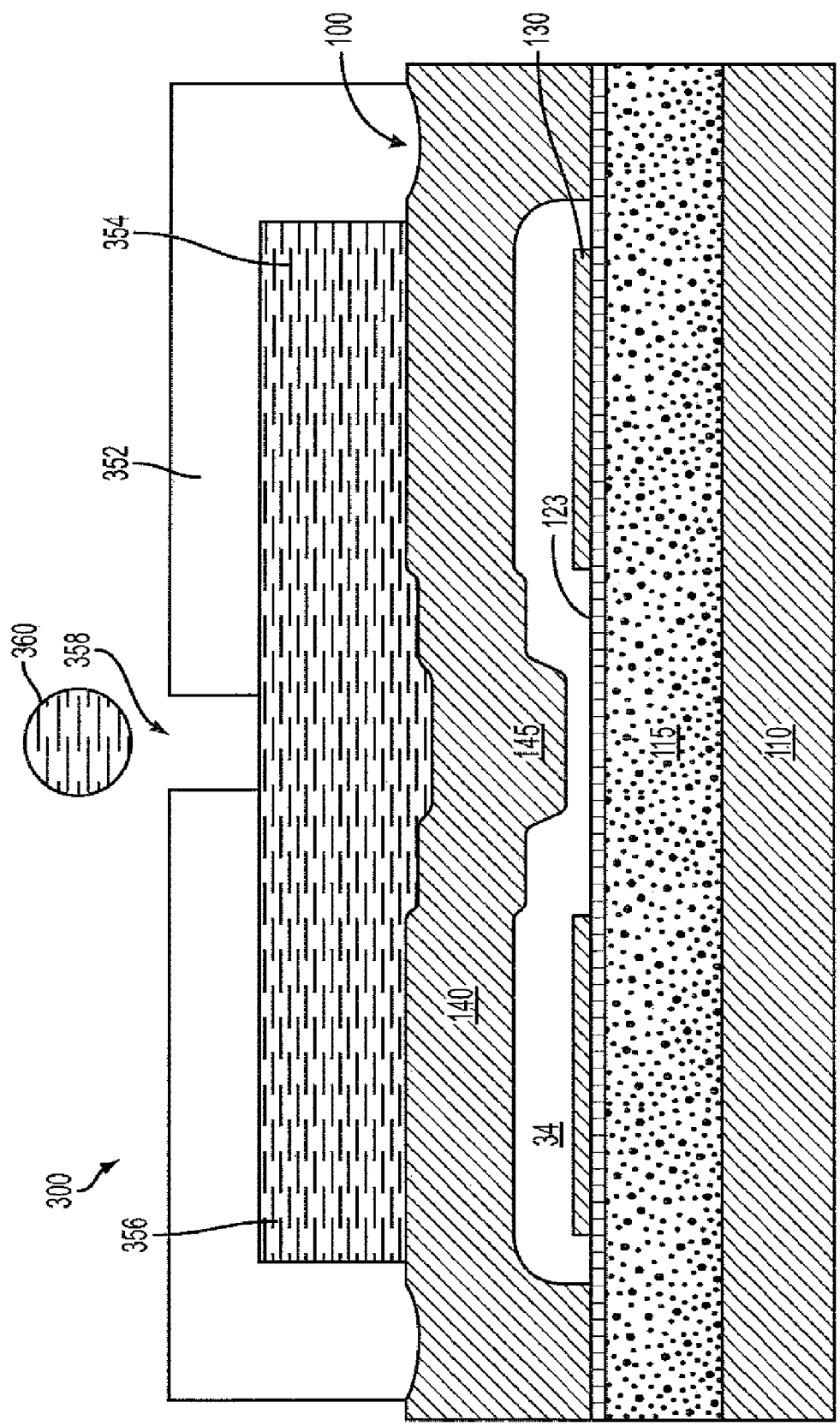
FIG. 3 depicts an exemplary fluid drop ejector that operates on the principle of electrostatic attraction as shown in FIG. 1 in accordance with the present teachings.

The electrostatic actuators (e.g., the device 100 of FIG. 1) of the present application can be used in any application for which electrostatic actuators are suitably employed. For example, the disclosed electrostatic actuators can be employed in fluid drop ejectors, known for use in ink jet printers. An exemplary fluid drop ejector 300 that operates on the principle of electrostatic attraction, according to one embodiment of the present application, can be described with reference to FIG. 3. The basic features of the fluid drop ejector can include an electrostatic actuator 100, as described above. The fluid drop ejector 300 can further include a faceplate layer 352. The faceplate layer 352 can be formed from any suitable material known in the art, such as, for example, a polyimide. A liquid 354 to be ejected can be provided in fluid pressure chamber 356 provided between the mechanical member 140 and the faceplate layer 352. A nozzle hole 358 can be formed in the faceplate layer 352 of the ejector 300.

In operation, a drive signal can be applied to the electrode 130 to provide a bias voltage that generates an electrostatic field between the electrode 130 and the mechanical member 140, which can be deflected towards the electrode 130 by an electrostatic force of the generated electrostatic field. This can draw additional fluid 354 into the fluid pressure chamber 356 to fill the additional volume created in fluid pressure chamber 356 by deflecting the mechanical member 140. Upon release of the bias voltage, elastic restoring forces of the mechanical member 140 can act to return the actuated member to its original state. This can transmit a pressure to the fluid pressure chamber 356, which acts to force fluid through the nozzle hole 358 as a drop 360.

Figure 4:
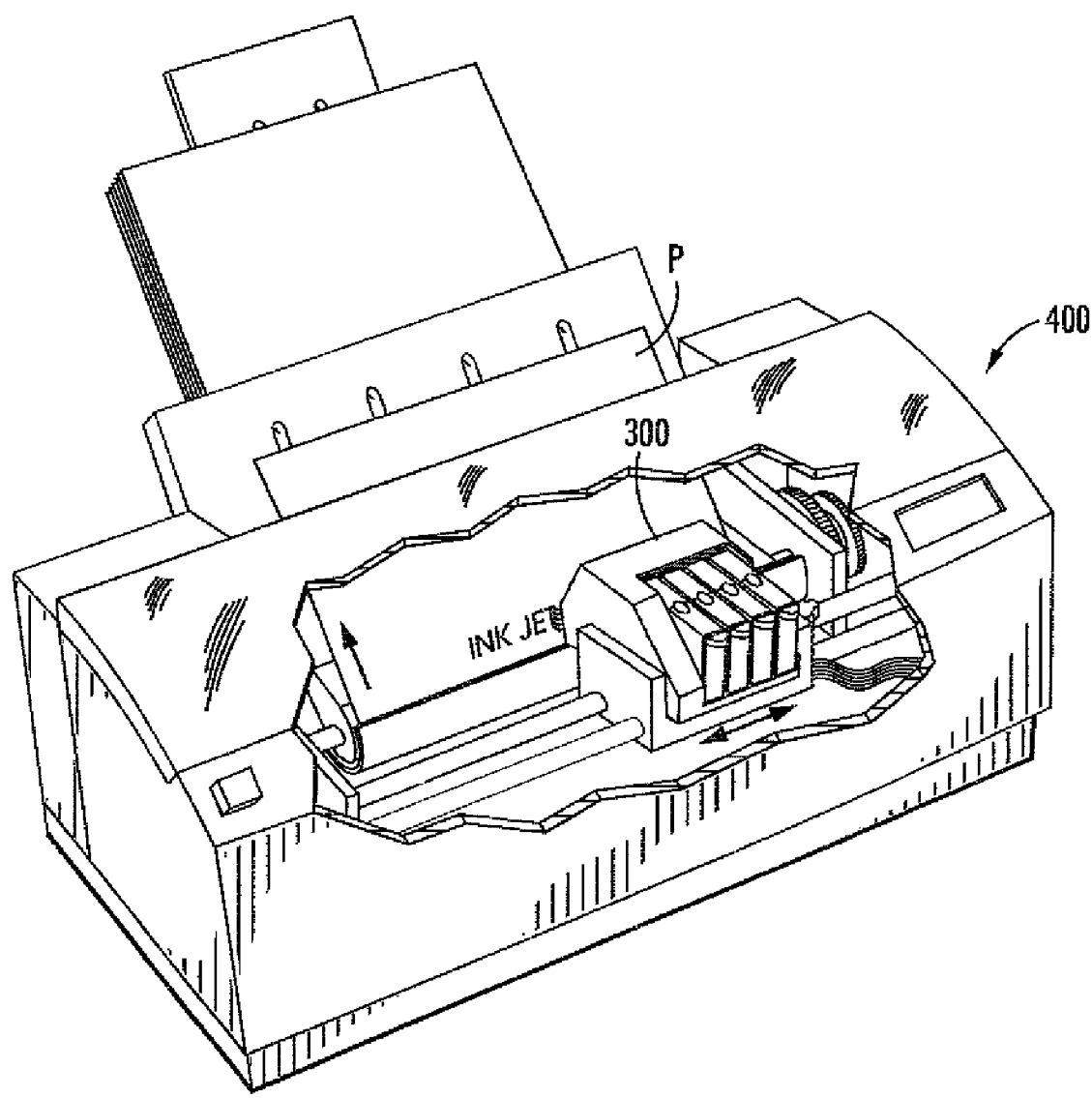
FIG. 4 depicts an exemplary ink jet printer including one or more fluid drop ejectors shown in FIG. 3 in accordance with the present teachings.

As shown in FIG. 4, one or more fluid drop ejectors 300 can be incorporated into a printer 400, such as an ink jet printer, to eject droplets of ink onto a medium substrate P. The individual fluid drop ejectors 300 can be operated in accordance with signals derived from an image source to create a desired printed image on print medium P. Printer 400 can take the form of the illustrated reciprocating carriage printer that moves a printhead in a back and forth scanning motion, or of a fixed type in which the print substrate moves relative to the printhead.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. An actuator device comprising:
   an electrode layer comprising a removed portion of the electrode layer that is free of a landing pad; and
   a mechanical member positioned in proximity to the electrode layer so as to provide a gap therebetween, the mechanical member comprising a dimple structure protruding out into the gap and aligned with the removed portion of the electrode layer, wherein each side of the dimple structure further comprises a dimple structure alignment tolerance, the mechanical member being capable of deflecting toward the electrode layer.

2. The actuator device of claim 1, wherein the electrode layer is disposed on an insulator layer, the insulator layer being exposed by the removed portion of the electrode layer and further contacting the dimple structure in operation.

3. The actuator device of claim 2, wherein the insulator layer comprises a silicon nitride.

4. The actuator device of claim 1, wherein each of the electrode layer and the mechanical member comprises one or more materials selected from the group consisting of doped polysilicon, conducting polymers, and metals.

5. The actuator device of claim 1, wherein the dimple structure protruding out into the gap has a thickness ranging from about 0.1 micron to about 1 micron.

6. The actuator device of claim 1, wherein the electrode layer has a thickness ranging from about 0.1 micron to about 1 micron.

7. The actuator device of claim 1, wherein the mechanical member has a thickness ranging from about 0.5 micron to about 5 microns.

8. The actuator device of claim 1, further comprising a minimum contact spacing between the mechanical member and the electrode layer, wherein the minimum contact spacing ranges from about 0.1 micron to about 1 micron.

9. The actuator device of claim 1, wherein the removed portion of the electrode layer has a width according to each width of the dimple structure and the dimple structure alignment tolerance, wherein the width of the removed portion is a reduced width when free of the landing pad.

10. The actuator device of claim 1, wherein:
    the mechanical member further comprises a polysilicon mechanical membrane having the dimple structure, wherein the dimple structure is about 0.5 micron thick and about 3 micron wide; and
    the electrode layer further comprises a polysilicon electrode layer of about 0.3 micron thick with the removed portion of about 7 microns wide in the center of the polysilicon electrode layer.

11. A fluid drop ejector comprising:
    an electrode layer comprising a removed portion out of the electrode layer, wherein the removed portion is free of a landing pad so as to provide an increased electrode area;
    a mechanical member positioned in proximity to and aligned with the electrode layer so as to provide a gap therebetween, the mechanical member comprising a dimple structure protruding out into the gap and aligned with the removed portion of the electrode layer, wherein each side of the dimple structure further comprises a dimple structure alignment tolerance, the mechanical member being capable of deflecting toward the electrode layer; and
    a face plate layer surrounding the mechanical member to form a fluid pressure chamber between the face plate layer and the mechanical member where fluid is capable of being stored, the face plate layer having a nozzle through which the fluid is ejected.

12. A printer containing at least one fluid drop ejector according to claim 11.

* * * * *